(12) United States Patent
Hayashi et al.

(10) Patent No.: US 9,161,473 B2
(45) Date of Patent: Oct. 13, 2015

(54) SURFACE MOUNT ELECTRONIC COMPONENT

(71) Applicant: MURATA MANUFACTURING CO., LTD., Nagaokakyo-Shi, Kyoto-fu (JP)

(72) Inventors: Koji Hayashi, Nagaokakyo (JP); Masatoshi Arishiro, Kyoto-Fu (JP); Seiichi Morita, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 209 days.

(21) Appl. No.: 13/706,510

(22) Filed: Dec. 6, 2012

(65) Prior Publication Data

US 2013/0094163 A1    Apr. 18, 2013

Related U.S. Application Data

(63) Continuation of application No. PCT/JP2011/055510, filed on Mar. 9, 2011.

(30) Foreign Application Priority Data

Jul. 8, 2010   (JP) ................................ 2010-155673

(51) Int. Cl.
*H05K 7/00* (2006.01)
*H05K 7/14* (2006.01)
*H01L 23/055* (2006.01)
*H01L 23/10* (2006.01)

(52) U.S. Cl.
CPC ................ *H05K 7/14* (2013.01); *H01L 23/055* (2013.01); *H01L 23/10* (2013.01); *H01L 2924/0002* (2013.01)

(58) Field of Classification Search
CPC ....................................................... H05K 7/14
USPC ......... 361/757, 752, 760, 772–775, 779, 783, 361/820; 174/260, 255, 265; 257/433, 678, 257/692, 696
See application file for complete search history.

(56) References Cited

U.S. PATENT DOCUMENTS

| | | | | |
|---|---|---|---|---|
| 5,058,856 A | * | 10/1991 | Gordon et al. | 251/11 |
| 5,984,257 A | * | 11/1999 | Baek et al. | 251/11 |
| 6,120,002 A | * | 9/2000 | Biegelsen et al. | 251/129.01 |
| 6,578,816 B1 | * | 6/2003 | Lille | 251/11 |
| 6,708,945 B2 | * | 3/2004 | Horiuchi et al. | 251/11 |
| 6,826,053 B2 | | 11/2004 | Kato et al. | |
| 8,154,094 B2 | | 4/2012 | Schmitz et al. | |

FOREIGN PATENT DOCUMENTS

| | | |
|---|---|---|
| CN | 1494149 A | 5/2004 |
| CN | 101331079 A | 12/2008 |

(Continued)

OTHER PUBLICATIONS

PCT/JP2011/055510 Written Opinion dated Mar. 25, 2011.

*Primary Examiner* — Angel R Estrada
*Assistant Examiner* — Dimary Lopez Cruz
(74) *Attorney, Agent, or Firm* — Arent Fox LLP

(57) ABSTRACT

A surface mount electronic component that includes a resin case, metal terminals, and a sealing metal plate that are molded integrally by insert molding. A hollow casing part and a through hole are formed in the case. The through hole leads from the hollow casing part to a surface of the case. The metal plate seals the through hole. The metal plate has a coefficient of linear expansion that is different from a coefficient of linear expansion of the case so that deformation to unseal the through hole occurs when heated.

12 Claims, 5 Drawing Sheets

(56) References Cited

FOREIGN PATENT DOCUMENTS

| | | | |
|---|---|---|---|
| FR | 0955537 | * | 8/2009 |
| JP | 2001-053179 A | | 2/2001 |
| JP | 3801025 | | 7/2006 |
| JP | 2006-294757 A | | 10/2006 |

* cited by examiner

SURFACE MOUNT ELECTRONIC COMPONENT

CROSS REFERENCE TO RELATED APPLICATIONS

The present application is a continuation of International application No. PCT/JP2011/055510, filed Mar. 9, 2011, which claims priority to Japanese Patent Application No. 2010-155673, filed Jul. 8, 2010, the entire contents of each of which are incorporated herein by reference.

FIELD OF THE INVENTION

The present invention relates to a surface mount electronic component that is to be mounted on a substrate or the like. More particularly, the invention relates to a surface mount electronic component that has a structure in which metal terminals and a resin case that has a hollow casing part are molded integrally by insert molding.

BACKGROUND OF THE INVENTION

With the advancement of high-density mounting in electronic equipment, various surface mount electronic components are used these days. Some electronic component chips need hermetic sealing. To encase such an electronic component chip, a surface mount electronic component including a resin case that has a hollow casing part has been used in the art.

FIG. 8 is a perspective view that illustrates the mounting structure of a surface mount electronic component disclosed in the patent literature (PTL) 1 shown below. A surface mount electronic component 1001 is mounted on a substrate 1002. Electrodes 1003 and 1004 are formed on the substrate 1002. The metal terminals 1005 and 1006 of the surface mount electronic component 1001 are bonded to the electrodes 1003 and 1004 by means of solder blobs 1007 and 1008, respectively. A reflow soldering method is used for the bonding.

The surface mount electronic component 1001 has the following structure: a top cover member 1010 is bonded to an open-topped case body 1009; a bonding material 1011 is sandwiched between the cover 1010 and the case 1009 to fix them to each other. Therefore, the surface mount electronic component 1001 has a casing structure that includes an inner space functioning as a casing space. An electronic component chip that is not illustrated is encased in this hollow casing part. The metal terminals 1005 and 1006 are connected to the electronic component chip.

When the surface mount electronic component 1001 is mounted to the substrate 1002 by using the reflow soldering method, solder is heated to a temperature at which it melts, for example, approximately 260° C. The internal pressure of the surface mount electronic component 1001 increases due to heating. In order to prevent the case from being damaged due to the increase in the internal pressure, a through hole 1012 is formed as illustrated in FIG. 9. The hole 1012 is formed through a sidewall of the case body 1009. The metal terminal 1005 extends from inside the through hole 1012 onto the bottom surface of the case body 1009 by way of the side surface thereof. In the process of the rising of the internal pressure due to heat applied at the time of reflow soldering, air escapes from the inside of the case body 1009 to the outside through the through hole 1012. By this means, it is possible to prevent the internal pressure of the case from increasing significantly. After heating during the process of reflow soldering, the mounted component is allowed to cool to room temperature. In the cooling step, the solder 1007 that is in a molten state hardens. As a result, as illustrated in FIG. 9, the metal terminal 1005 and the electrode 1003 become bonded to each other. Since a part of the solder 1007 in the molten state flows into the through hole 1012, the through hole 1012 gets sealed as a result of the solidification of the molten solder. Therefore, the case that has been subjected to reflow soldering is hermetically sealed.

PTL 1: Japanese Unexamined Patent Application Publication No. 2006-294757

SUMMARY OF THE INVENTION

In the surface mount electronic component 1001 disclosed in the PTL 1, when it is cooled to room temperature after heating during the process of reflow soldering, the internal pressure of the hollow casing part inside the case becomes negative. For this reason, there is a risk that, when the molten solder 1007 flows into the through hole 1012, a part of it flows beyond the through hole 1012 into the hollow casing part. If the solder 1007 enters the hollow casing part, there is a risk that it sticks to the inner electronic component chip, wiring, and the like. The sticking of the solder to them makes it difficult to achieve desired electric performance, causing a problem of a decrease in a non-defective rate.

The same problem arises when an electro-conductive adhesive that hardens when heated is used as a substitute for solder.

An object of the present invention is to provide a surface mount electronic component that makes it possible to hermetically seal a hollow casing part in a secure manner and is less susceptible to the flowing of solder or an electro-conductive adhesive into the hollow casing part after mounting to a substrate.

A surface mount electronic component according to a certain aspect of the present invention includes: a resin case that includes a hollow casing part; a metal terminal that is molded integrally by insert molding together with the resin case, the metal terminal extending from the hollow casing part to an outside of the resin case; and a sealing metal plate that is molded integrally by insert molding together with the resin case. A through hole that leads from the hollow casing part of the resin case to a surface of the resin case is formed in the resin case. The sealing metal plate seals the through hole. The sealing metal plate has a coefficient of linear expansion that is different from a coefficient of linear expansion of the resin case so that deformation to unseal the through hole arise when heated.

In a surface mount electronic component according to the above aspect of the invention, the coefficient of linear expansion of the sealing metal plate may be higher than the coefficient of linear expansion of the resin case.

The coefficient of linear expansion of the sealing metal plate may be lower than the coefficient of linear expansion of the resin case.

That is, regardless of whether the coefficient of linear expansion of the sealing metal plate is higher than, or lower than, the coefficient of linear expansion of the resin case, it is possible to cause the sealing metal plate and the through hole to become deformed to unseal the through hole due to a difference between the coefficients of linear expansion, which is achieved by ingeniously designing the shape and structure of the sealing metal plate and the through hole.

In a surface mount electronic component according to another aspect of the invention, the through hole includes a first through-hole part that is formed at a hollow-casing-part side and further includes a second through-hole part that is in communication with the first through-hole part and is formed at a position that is closer to the surface of the resin case as compared with the first through-hole part; an opening area of the second through-hole part at one end that is closer to the first through-hole part is larger than an opening area of the first through-hole part at one end that is closer to the second through-hole part, or, alternatively, an opening area of the first through-hole part at one end that is closer to the second through-hole part is larger than an opening area of the second through-hole part at one end that is closer to the first through-hole part; and a stepped part that includes a latch surface that extends in a direction intersecting with a direction in which the through hole extends is formed between the first through-hole part and the second through-hole part. With such a structure, it is possible to seal the through hole securely between the first through-hole part and the second through-hole part by using the contact of a surface of the metal plate with the latch surface. Therefore, it is preferred that the surface of the metal plate should be in contact with the latch surface.

In a surface mount electronic component according to still another aspect of the invention, the sealing metal plate doubles as the metal terminal. As mentioned above, the sealing metal plate may double as the metal terminal of the surface mount electronic component. With such a structure, it is not necessary to provide the sealing metal plate as a member that is separated from the metal terminal. Therefore, it is possible to reduce the number of components.

A surface mount electronic component according to still another aspect of the invention further includes an electronic component element that is encased in the hollow casing part. Thus, with selection out of various electronic component elements, a surface mount electronic component that offers various electric characteristics with a high non-defective rate can be provided.

In a surface mount electronic component according to a certain aspect of the invention, the sealing metal plate seals the through hole that is formed in the resin case. Therefore, it is possible to hermetically seal the hollow casing part. In addition, since the sealing metal plate has a coefficient of linear expansion that is different from a coefficient of linear expansion of the resin case so that the sealing metal plate becomes deformed to unseal the through hole when heated, it is possible to reduce the internal pressure of the hollow casing part during the process of surface mounting using, for example, reflow soldering or bonding by means of a conductive adhesive that hardens when heated. Thus, the resin case is less susceptible to damage, etc. As temperature decreases after heating, the sealing metal plate returns to a state in which it seals the through hole. Thus, it is possible to securely seal the hollow casing part of the surface mount electronic component after mounting.

DETAILED DESCRIPTION OF THE PREFERRED EMBODIMENTS

With reference to the accompanying drawings, exemplary embodiments of the present invention will now be explained, thereby clarifying its aspects.

Figure 1A:
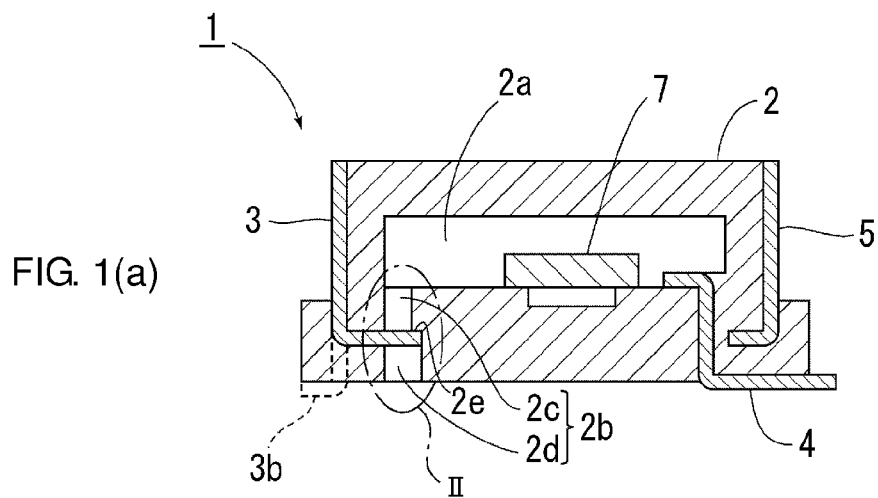
FIG. 1(a) is a front sectional view of a surface mount electronic component according to an exemplary embodiment of the present invention.
Figure 1B:
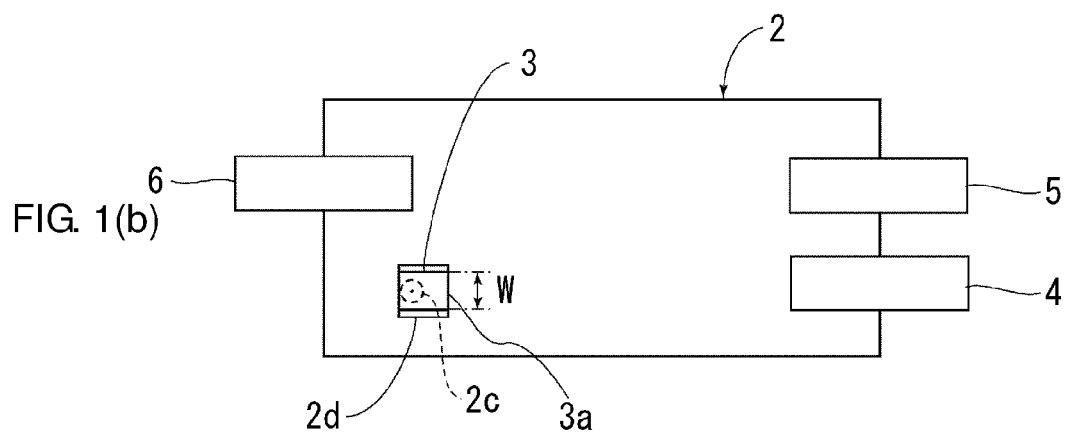
FIG. 1(b) is a bottom view thereof.

FIG. 1(a) is a front sectional view of an electronic component according to a first embodiment of the present invention. FIG. 1(b) is a bottom view thereof.

A surface mount electronic component 1 includes a resin case 2. The resin case 2 is a resin mold body that has a hollow casing part 2a. The material of the resin case 2 is not limited to any specific resin. For example, it may be heat-resistant engineering plastic such as PPS (polyphenylene sulfide resin). In the present embodiment of the invention, LCP (liquid crystal polymer) is used as the material of the resin case 2.

The resin case 2, a sealing metal plate 3, and metal terminals 4 and 5 constitute a single molded structure. Insert molding is used to mold them integrally, more specifically, as follows. The sealing metal plate 3 and the metal terminals 4 and 5 are placed inside a metal mold. Then, resin that will form into the resin case 2 is injected into the metal mold for insert molding.

An electronic component element 7 is encased in the hollow casing part 2a. In the present embodiment of the invention, an infrared radiation sensor element is used as the electronic component element 7. The electronic component element 7 is not limited to an infrared radiation sensor element. For example, an FET may be encased in the hollow casing part 2a as the electronic component element 7. A plurality of electronic component elements may be encased in the hollow casing part 2a.

Each of the metal terminals 4 and 5 is electrically connected to the electronic component element 7 at a part that is not illustrated in FIG. 1(a). Therefore, each of the metal terminals 4 and 5 extends from inside the hollow casing part 2a onto a surface of the resin case 2.

It is shown in FIG. 1(*a*) as if the metal terminal 5 did not extend onto the lower surface of the surface mount electronic component 1. However, said metal terminal 5 actually extends in a direction toward the back of the figure in such a way that, as illustrated in FIG. 1(*b*), a part of said metal terminal is formed on the lower surface of the surface mount electronic component 1. In addition to the metal terminals 4 and 5 illustrated in FIG. 1(*a*), another metal terminal 6, which is not illustrated in FIG. 1(*a*), extends from inside the hollow casing part 2*a* onto the lower surface of the surface mount electronic component 1, which means that a part of said metal terminal is also formed on the lower surface.

The metal terminals 4, 5, and 6 of the surface mount electronic component 1 are bonded to the surface of a substrate by using a conductive bonding material such as reflow solder or a conductive adhesive.

The metal terminals 4, 5, and 6 are made of the same metal material as that of the sealing metal plate 3 described later. In the present embodiment of the invention, the metal terminals 4, 5, and 6 and the sealing metal plate 3 are made of Cu alloy having a coefficient of linear expansion of 18.2 ppm/° C.

Notwithstanding the above, the metal terminals 4, 5, and 6 may be made of a metal material that is different from that of the sealing metal plate 3.

Figure 3:
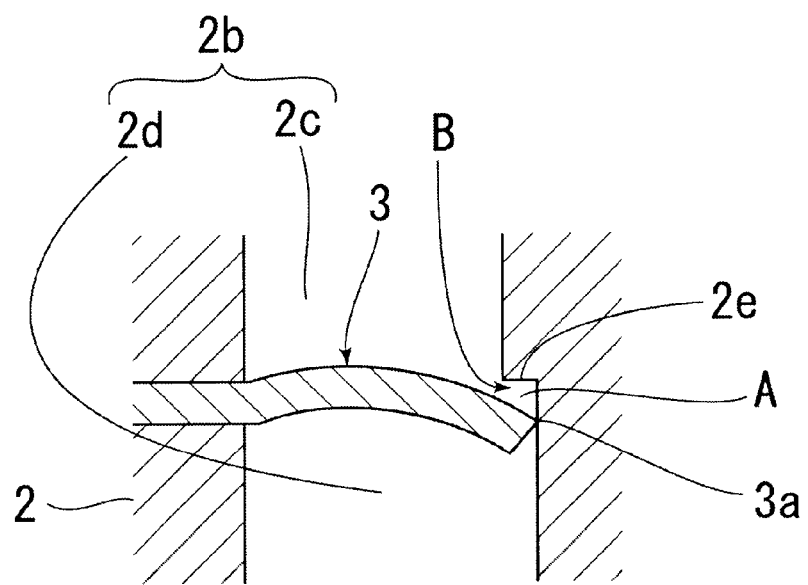
FIG. 3 is a partially-cut-away-and-enlarged front sectional view for explaining, in an exemplary embodiment of the present invention, a state in which the through hole is unsealed due to the deformation of the sealing metal plate when heated during the process of reflow soldering.

A through hole 2*b* is formed between the hollow casing part 2*a* and the lower surface of the resin case 2. As illustrated in FIG. 3, the through hole 2*b* includes a first through-hole part 2*c* and a second through-hole part 2*d*. The first through-hole part 2*c* is formed at a hollow-casing-part side, that is, at a position that is closer to the hollow casing part 2*a*. The second through-hole part 2*d* is in communication with the first through-hole part 2*c*. The second through-hole part 2*d* is formed at a position that is closer to the lower surface of the resin case 2. The area size of the opening of the first through-hole part 2*c* at its one end that is closer to the second through-hole part 2*d* is smaller than the area size of the opening of the second through-hole part 2*d* at its one end that is closer to the first through-hole part 2*c*. Therefore, a stepped part that includes a latch surface 2*e* is formed between the first through-hole part 2*c* and the second through-hole part 2*d*.

In the present embodiment of the invention, the cross-sectional shape of the first through-hole part 2*c* is a circle. However, the cross-sectional shape of the first through-hole part 2*c* is not limited thereto. For example, it may be a quadrangle.

On the other hand, the cross-sectional shape of the second through-hole part 2*d* is a rectangle. However, the cross-sectional shape of the second through-hole part 2*d* is not limited thereto.

In the present embodiment of the invention, the through hole 2*b* leads from the hollow casing part 2*a* to the lower surface of the resin case 2. Notwithstanding the above, the through hole 2*b* may be formed in such a way as to lead to a surface other than the lower surface of the resin case 2. For example, the through hole 2*b* may lead to a side surface or the upper surface.

Figure 2:
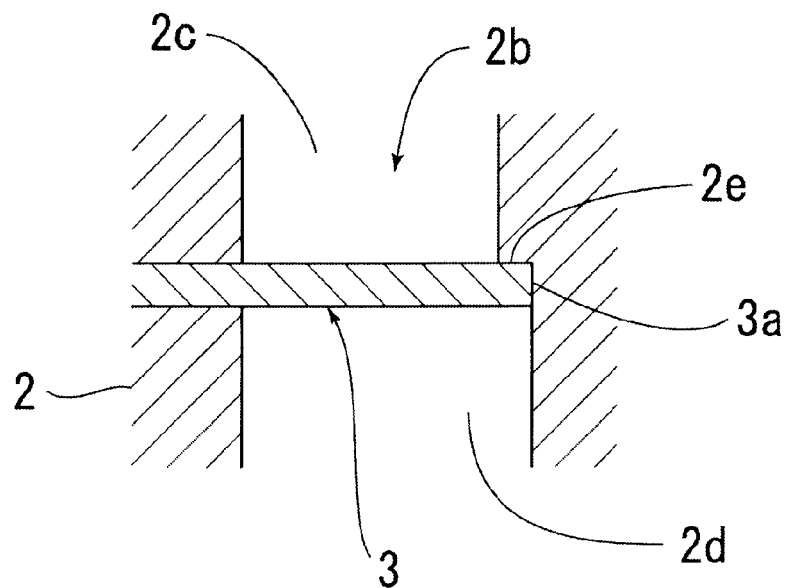
FIG. 2 is a front sectional view of a part shown by II in FIG. 1(a) as an essential part of a surface mount electronic component according to an exemplary embodiment of the present invention, wherein said part is shown in an enlarged view with a partial cutaway for explaining a state in which a sealing metal plate seals a through hole.

The sealing metal plate 3 seals the through hole 2*b*. More specifically, as illustrated in FIG. 2, a part near the tip 3*a* of the sealing metal plate 3 protrudes into the space of the through hole 2*b*. A principal surface of the sealing metal plate 3 is in contact with the latch surface 2*e* mentioned above. The tip-side part of the sealing metal plate 3 is located therein in such a way as to seal the lower-end opening of the first through-hole part 2*c*. Therefore, the size W of the sealing metal plate 3 in the width direction is larger than the diameter of the first through-hole part 2*c*. The width direction along which the size W of the sealing metal plate 3 is defined herein is a direction orthogonal to a direction toward the tip 3*a* of the sealing metal plate 3.

In the present embodiment of the invention, the sealing metal plate 3 is provided in such a way that its principal surface is in contact with the latch surface 2*e* and, in addition, said surface closes the first through-hole part 2*c*. Therefore, the space inside the hollow casing part 2*a* is hermetically sealed in a secure manner at normal temperature ranging from approximately 10 to 30° C.

In the present embodiment of the invention, the coefficient of linear expansion of the sealing metal plate 3 is 18.2 ppm/° C. as described earlier. On the other hand, the coefficient of linear expansion of LCP (liquid crystal polymer), which is the resin material of the resin case 2, is 16 ppm/° C. Therefore, the coefficient of linear expansion of the sealing metal plate 3 is higher than the coefficient of linear expansion of the resin case 2.

The material of the sealing metal plate 3 is not limited to any specific metal on the condition that the coefficient of linear expansion of the sealing metal plate 3 is higher than the coefficient of linear expansion of the resin case 2. Therefore, for example, aluminum having a coefficient of linear expansion of 24 ppm/° C. or zinc having a coefficient of linear expansion of 39 ppm/° C. may be used as a substitute for Cu alloy.

In the present embodiment of the invention, the sealing metal plate 3 described above, which hermetically seals the hollow casing part 2*a* in a secure manner at normal temperature, opens the through hole 2*b* for unsealing when heated during the process of reflow soldering or the process of bonding by means of a conductive adhesive. With reference to FIGS. 2 and 3, the above behavior of the sealing metal plate 3 for sealing and unsealing will now be explained in more detail.

In the first embodiment of the invention, the coefficient of linear expansion of the sealing metal plate 3 is set higher than the coefficient of linear expansion of the resin case 2 so that, when heated, the sealing metal plate 3 can become deformed in such a way that the tip 3*a* of the sealing metal plate 3 comes away from the latch surface 2*e* to allow inner air to escape as shown by an arrow B.

Under normal temperature conditions, for example, at a room temperature of approximately 25° C., the first through-hole part 2*c* is closed by the sealing metal plate 3 as illustrated in FIG. 2. Therefore, the hollow casing part 2*a* is hermetically sealed.

When the surface mount electronic component 1 is mounted to a substrate by using reflow soldering, it is heated to a temperature of approximately 260 to 280° C. Since solder melts due to heating in this process, the metal terminals 4, 5, and 6 described earlier get connected to electrodes formed on the surface of the substrate. In this process, the sealing metal plate 3 is also heated to a temperature of approximately 260 to 280° C.

As described above, the coefficient of linear expansion of the sealing metal plate 3 is higher than the coefficient of linear expansion of the resin case 2. For this reason, as illustrated in FIG. 3, the aforementioned part of the sealing metal plate 3 that protrudes into the space of the through hole 2*b* becomes deformed due to expansion. As a result, the protruding part of the sealing metal plate 3 inside the through hole 2*b* stretches. Since the tip 3*a* of the sealing metal plate 3 was in surface contact with the inner wall of the second through-hole part 2*d* before heating, as the length of the protruding part of the sealing metal plate 3 inside the through hole 2*b* increases, it becomes deformed as illustrated in FIG. 3. That is, the protruding part of the sealing metal plate 3 inside the through hole 2b becomes deformed in such a way that the convex-side surface of the deformed part is oriented toward the first through-hole part 2c, which means that the tip 3a of the sealing metal plate 3 comes away from the latch surface 2e. As a result, a gap A is formed between the latch surface 2e and the sealing metal plate 3. Consequently, inner air pressurized due to heating is allowed to escape from the first through-hole part 2c to the second through-hole part 2d through the gap A as shown by the arrow B. Thus, it is possible to reduce the internal pressure of the resin case 2 without failure.

After heating during the process of bonding, the temperature of the resin case 2 mounted on the substrate decreases gradually toward normal temperature. In this process, the shape of the sealing metal plate 3 returns to the state illustrated in FIG. 2 from the state illustrated in FIG. 3. Therefore, the sealing metal plate 3 functions to close the first through-hole part 2c again after the completion of mounting. This means that the hollow casing part 2a is sealed securely.

Thus, it is possible to reduce the internal pressure of the resin case 2 without failure and, in addition, hermetically seal the hollow casing part 2a in a secure manner both before and after mounting.

In FIG. 1(a), the through hole 2b is shown as a hole that has a fairly large diameter for the purpose of facilitating understanding. However, a difference between the coefficient of linear expansion of the sealing metal plate 3 and the coefficient of linear expansion of the resin case 2 is used herein to cause deformation; in addition, the amount of deformation of the sealing metal plate 3 and the resin case 2 due to heating is very small, which is in the order of a few micrometers or so. Therefore, the actual diameter of the through hole 2b is very small. For example, when the size of the resin case 2 is approximately 2 to 10 mm, an appropriate opening diameter of the first through-hole part 2c and an appropriate opening diameter of the second through-hole part 2d are 0.5 mm and 0.6 mm, respectively.

In the above embodiment of the invention, the coefficient of linear expansion of the sealing metal plate 3 is higher than the coefficient of linear expansion of the resin case 2. Notwithstanding the above, the coefficient of linear expansion of the sealing metal plate 3 may be lower than the coefficient of linear expansion of the resin case 2. In the sealing metal plate 3 illustrated in FIG. 4, the coefficient of linear expansion of the sealing metal plate 3 is set lower than the coefficient of linear expansion of the resin case 2 so that, when heated, the sealing metal plate 3 can become deformed in such a way that a gap C will be formed.

Figure 4:
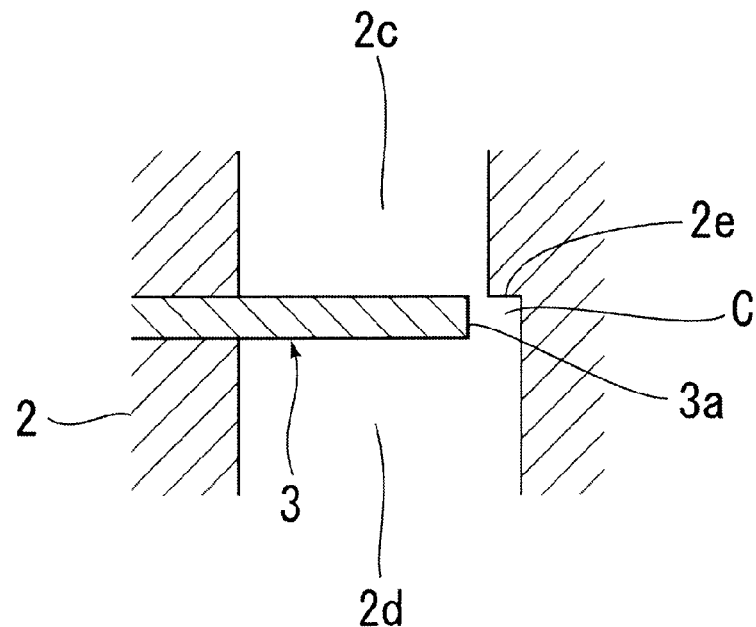
FIG. 4 is a partially-cut-away-and-enlarged front sectional view for explaining, in a variation example of an exemplary embodiment of the present invention, a state in which the through hole is unsealed due to the deformation of the sealing metal plate when heated during the process of reflow soldering.

In this case, as illustrated in FIG. 4, which shows a variation example, the sealing metal plate 3 deformed from the initial state illustrated in FIG. 2 when heated. As a result, the gap C is formed in front of the tip 3a of the sealing metal plate 3. Therefore, the variation example of the present embodiment of the invention also makes it possible to reduce the internal pressure of the resin case 2. As in the present embodiment of the invention, as temperature decreases after heating, the shape of the sealing metal plate 3 returns to the state illustrated in FIG. 2. Thus, it is possible to hermetically seal the hollow casing part 2a in a secure manner both before and after mounting.

For example, titanium having a coefficient of linear expansion of 8 ppm/° C. or platinum having a coefficient of linear expansion of 9 ppm/° C. can be used as a metal material having a coefficient of linear expansion that is lower than that of the resin case 2.

Note that the only thing required here is that the coefficient of linear expansion of either the resin case 2 or the sealing metal plate 3 is higher than that of the other. The material of the resin case 2 and the material of the sealing metal plate 3 can be selected out of various kinds of resin materials and metal materials that satisfy the above relation between the coefficients.

In the present embodiment of the invention, the sealing metal plate 3 is provided as a member that is separated from the metal terminals 4, 5, and 6. However, the sealing metal plate 3 may double as a metal terminal.

For example, as shown in FIG. 1(a) by an alternate long and short dash line II, the sealing metal plate 3 may have a modified structure in which the lower part of the sealing metal plate 3 extends onto the lower surface of the resin case 2 and, more specifically, has a bottom terminal part 3b on and along the lower surface of the resin case 2. In addition, the sealing metal plate 3 may be electrically connected to wiring that is connected to the electronic component element 7 housed inside the resin case 2. In the structure described above, the sealing metal plate 3 doubles as a metal terminal. In this case, it is not necessary to provide a metal terminal that is separated from the sealing metal plate. Therefore, it is possible to reduce the number of components.

The sealing metal plate 3 having the terminal part 3b may be a shield material that is not connected to the electronic component element 7. In this case, a metal terminal functioning as an electromagnetic shield doubles as the sealing metal plate 3.

Figure 5:
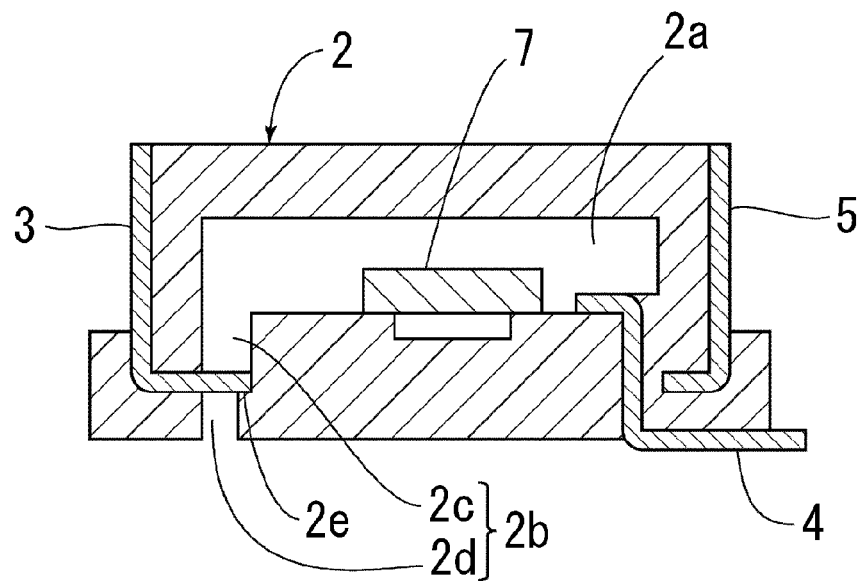
FIG. 5 is a front sectional view of a surface mount electronic component according to a second embodiment of the present invention.
Figure 6:
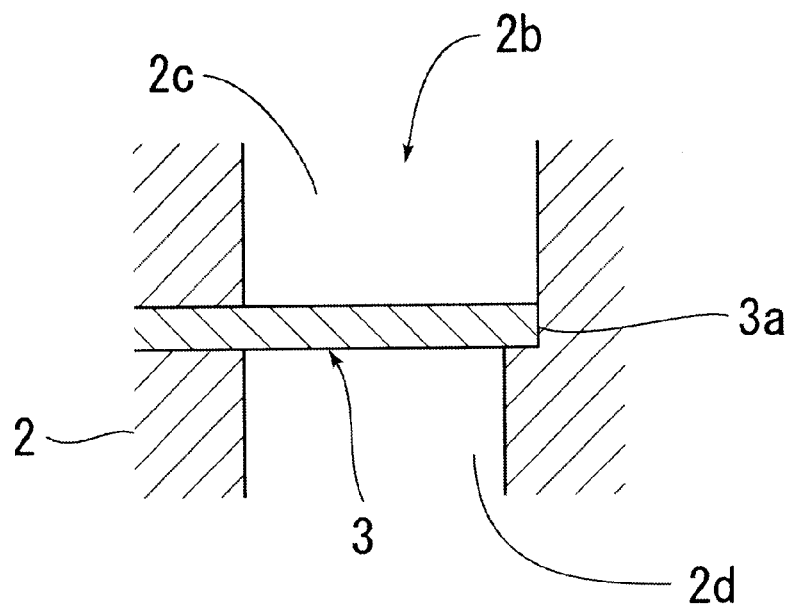
FIG. 6 is a partially-cut-away-and-enlarged front sectional view for explaining a state in which a sealing metal plate of a surface mount electronic component according to the second embodiment of the present invention seals a through hole thereof.

FIG. 5 is a front sectional view of a surface mount electronic component according to a second embodiment of the present invention. The present embodiment of the invention is different from the first embodiment illustrated in FIG. 1 in that the relation between the diameter of the first through-hole part 2c and the diameter of the second through-hole part 2d is reversed. More specifically, the area size of the opening of the second through-hole part 2d is smaller than the area size of the opening of the first through-hole part 2c, which is formed at a position that is closer to the hollow casing part 2a. The principal surface of the sealing metal plate 3 is in contact with the latch surface 2e. Therefore, the sealing metal plate 3 seals the upper-end opening of the second through-hole part 2d. As described above, in the through hole 2b, the area size of the opening of the first through-hole part 2c may be larger than the area size of the opening of the second through-hole part 2d. Even in this case, since the upper-end opening of the second through-hole part 2d is closed by means of the sealing metal plate 3 under normal temperature conditions as illustrated in FIG. 6, it is possible to hermetically seal the hollow casing part 2a.

Figure 7:
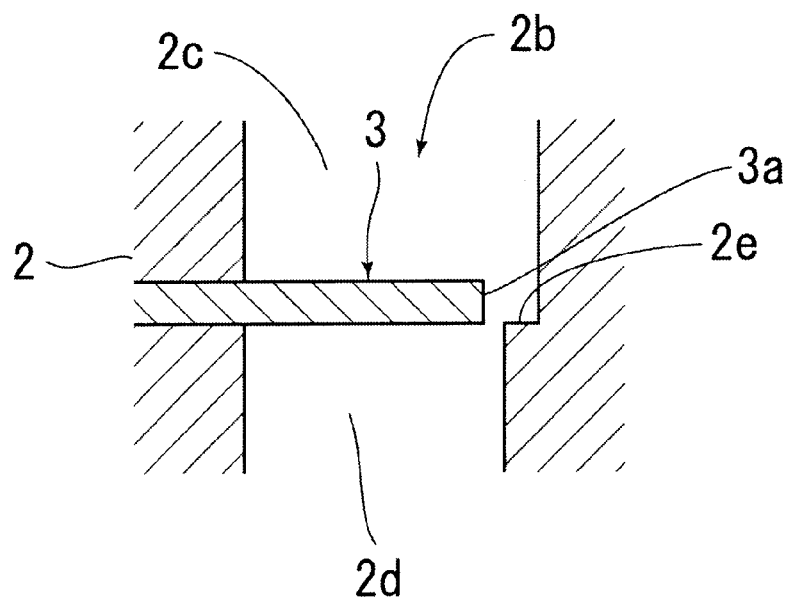
FIG. 7 is a partially-cut-away-and-enlarged front sectional view for explaining a state in which the sealing metal plate of the surface mount electronic component according to the second embodiment of the present invention unseals the through hole thereof.
Figure 8:
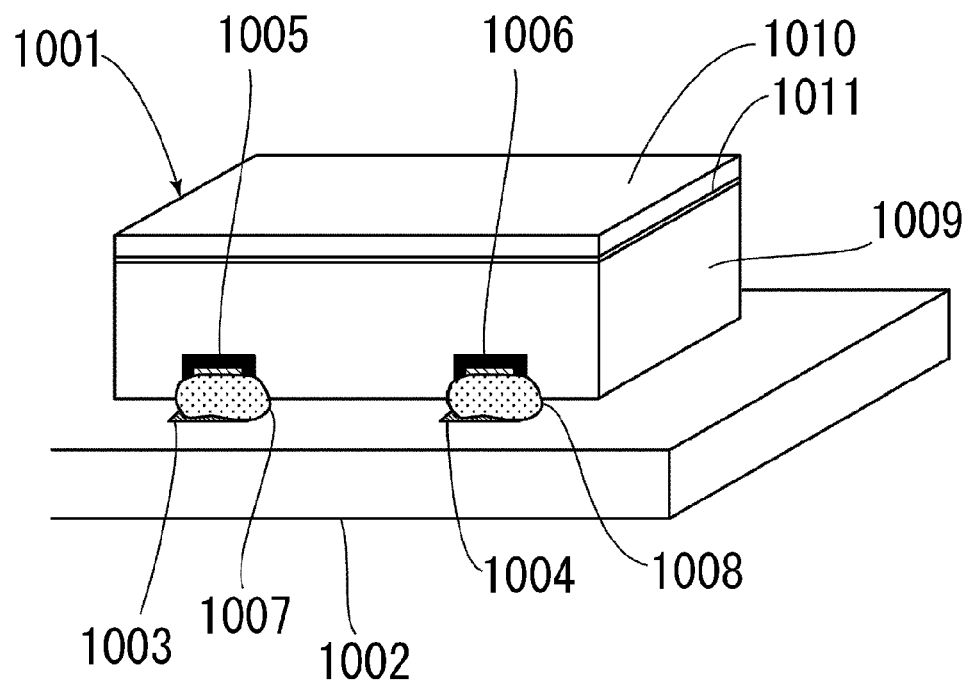
FIG. 8 is a perspective view that schematically illustrates a state in which a surface mount electronic component according to prior art is mounted on a substrate.
Figure 9:
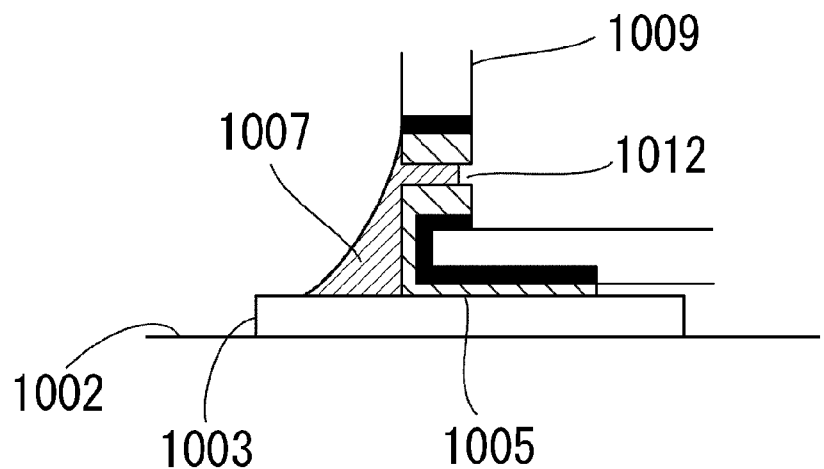
FIG. 9 is a partially-cut-away-and-enlarged side sectional view that illustrates an essential part of a structure in which the surface mount electronic component according to prior art is mounted on the substrate.

When the structure according to the present embodiment of the invention is adopted, the coefficient of linear expansion of the sealing metal plate 3 is set lower than the coefficient of linear expansion of the resin case 2 for unsealing when heated. For this reason, as illustrated in FIG. 7, the tip 3a of the sealing metal plate 3 comes away from the latch surface 2e as a result of heating during the process of reflow soldering or the process of bonding by means of a conductive adhesive. Therefore, the gap C is formed in front of the tip 3a as in FIG. 4. It is possible to prevent the internal pressure of the hollow casing part 2a from increasing when heated. As temperature decreases after heating, the shape of the sealing metal plate 3 returns to the state illustrated in FIG. 6. Thus, it is possible to hermetically seal the hollow casing part 2a in a secure manner both before and after mounting.

REFERENCE SIGNS LIST 1 surface mount electronic component
2 resin case

2*a* hollow casing part
2*b* through hole
2*c*, 2*d* first, second through-hole part
2*e* latch surface
3 sealing metal plate
3*a* tip
3*b* terminal part
4, 5, 6 metal terminal
7 electronic component element

The invention claimed is:

1. A surface mount electronic component comprising:
a resin case defining a hollow casing part and a through hole that leads from the hollow casing part to a surface of the resin case, the through hole including a first through-hole part leading from the hollow casing part and a second through-hole part in communication with the first through-hole part and extending to the surface of the resin case;
a metal terminal integral with the resin case, the metal terminal extending from the hollow casing part to an outside of the resin case; and
a sealing metal plate that integral with the resin case and positioned to seal the through hole, wherein
the sealing metal plate has a coefficient of linear expansion that is different from a coefficient of linear expansion of the resin case so that deformation of the sealing metal plate to unseal the through hole occurs when the surface mount electronic component is heated,
wherein a first opening area of the second through-hole part adjacent to the first through-hole part is larger than a second opening area of the first through-hole part adjacent to the second through-hole part, such that a stepped part that includes a latch surface is located between the first through-hole part and the second through-hole part.

2. The surface mount electronic component according to claim 1, wherein the coefficient of linear expansion of the sealing metal plate is higher than the coefficient of linear expansion of the resin case.

3. The surface mount electronic component according to claim 1, wherein the coefficient of linear expansion of the sealing metal plate is lower than the coefficient of linear expansion of the resin case.

4. The surface mount electronic component according to claim 1, wherein the sealing metal plate is in contact with the latch surface to seal the through hole.

5. The surface mount electronic component according to claim 1, wherein the sealing metal plate is part of the metal terminal.

6. The surface mount electronic component according to claim 1, further comprising an electronic component element encased in the hollow casing part.

7. A surface mount electronic component comprising:
a resin case defining a hollow casing part and a through hole that leads from the hollow casing part to a surface of the resin case, the through hole including a first through-hole part leading from the hollow casing part and a second through-hole part in communication with the first through-hole part and extending to the surface of the resin case;
a metal terminal integral with the resin case, the metal terminal extending from the hollow casing part to an outside of the resin case; and
a sealing metal plate that integral with the resin case and positioned to seal the through hole, wherein
the sealing metal plate has a coefficient of linear expansion that is different from a coefficient of linear expansion of the resin case so that deformation of the sealing metal plate to unseal the through hole occurs when the surface mount electronic component is heated
wherein a first opening area of the first through-hole part adjacent to the second through-hole part is larger than a second opening area of the second through-hole part adjacent to the first through-hole part, such that a stepped part that includes a latch surface is located between the first through-hole part and the second through-hole part.

8. The surface mount electronic component according to claim 7, wherein the sealing metal plate is in contact with the latch surface to seal the through hole.

9. The surface mount electronic component according to claim 7, wherein the coefficient of linear expansion of the sealing metal plate is higher than the coefficient of linear expansion of the resin case.

10. The surface mount electronic component according to claim 7, wherein the coefficient of linear expansion of the sealing metal plate is lower than the coefficient of linear expansion of the resin case.

11. The surface mount electronic component according to claim 7, wherein the sealing metal plate is part of the metal terminal.

12. The surface mount electronic component according to claim 7, further comprising an electronic component element encased in the hollow casing part.

\* \* \* \* \*